United States Patent
Herner

(10) Patent No.: US 7,678,420 B2
(45) Date of Patent: Mar. 16, 2010

(54) METHOD OF DEPOSITING GERMANIUM FILMS

(75) Inventor: Scott Brad Herner, San Jose, CA (US)

(73) Assignee: Sandisk 3D LLC, Milpitas, CA (US)

(*) Notice: Subject to any disclaimer, the term of this patent is extended or adjusted under 35 U.S.C. 154(b) by 1029 days.

(21) Appl. No.: 11/159,031

(22) Filed: Jun. 22, 2005

(65) Prior Publication Data

US 2006/0292301 A1 Dec. 28, 2006

(51) Int. Cl.
*C23C 16/00* (2006.01)
*C23C 16/22* (2006.01)

(52) U.S. Cl. .............. 427/248.1; 427/255.11; 427/255.15; 427/255.18

(58) Field of Classification Search .......... 427/248.1, 427/255.11, 255.15, 255.18
See application file for complete search history.

(56) References Cited

U.S. PATENT DOCUMENTS

| | | | |
|---|---|---|---|
| 3,473,978 A | | 10/1969 | Jackson, Jr. et al. |
| 5,510,645 A | * | 4/1996 | Fitch et al. ................ 257/522 |
| 6,373,112 B1 | * | 4/2002 | Murthy et al. ............ 257/407 |
| 6,887,773 B2 | * | 5/2005 | Gunn et al. ............... 438/481 |
| 2004/0067631 A1 | * | 4/2004 | Bu et al. ................... 438/592 |
| 2004/0108559 A1 | * | 6/2004 | Sugii et al. ............... 257/411 |
| 2005/0092235 A1 | * | 5/2005 | Brabant et al. ........... 117/105 |
| 2005/0118837 A1 | * | 6/2005 | Todd et al. ............... 438/791 |
| 2005/0151209 A1 | * | 7/2005 | Yamamoto et al. ...... 257/407 |
| 2005/0191826 A1 | * | 9/2005 | Bauer et al. .............. 438/509 |

FOREIGN PATENT DOCUMENTS

| | | |
|---|---|---|
| EP | 0 518 800 A2 | 12/1992 |
| EP | 518800 A2 * | 12/1992 |
| FR | 2 783 254 | 3/2000 |

OTHER PUBLICATIONS

Murota et al. "Atomically Controlled Processing for Future Si Based Devices" Laboratory for Electronic Intelligent Systems, pp. 31-34 Sep. 2004.*
Junichi Murota et al., "Atomically Controlled Processing for Future Si-Based Devices", Sep. 2004, IEEE, pp. 31-34.
Junichi Murota et al., "Germanium Epitaxial Growth Mechanism In Low-Pressure CVD Using Germane Gas", Oct. 14-19, 1990, Fall Meeting, Seattle, WA, pp. 814-815.
International Search Report and Written Opinion of International Application No. PCT/US2006/024768 mailed Nov. 3, 2006.
International Preliminary Report on Patentability of International Application No. PCT/US2006/024768 issued Dec. 24, 2007.
Dec. 25, 2009 Office Action of counterpart Chinese Application No. 200680030684.3.

* cited by examiner

*Primary Examiner*—Timothy H Meeks
*Assistant Examiner*—Cachet I Sellman
(74) *Attorney, Agent, or Firm*—Dugan & Dugan, PC

(57) ABSTRACT

A chemical vapor deposition method provides a smooth continuous germanium film layer, which is deposited on a metallic substrate at a sufficiently lower temperature to provide a germanium device suitable for use with temperature sensitive materials such as aluminum and copper. Another chemical vapor deposition method provides a smooth continuous silicon germanium film layer, which is deposited on a silicon dioxide substrate at a sufficiently low temperature to provide a germanium device suitable for use with temperature sensitive materials such as aluminum, copper and chalcogenides memory materials.

29 Claims, 14 Drawing Sheets

S4700 10.0kV 7.1mm x110k SE(U) 5/24/2005 14:57  500nm

US 7,678,420 B2

METHOD OF DEPOSITING GERMANIUM FILMS

BACKGROUND OF THE INVENTION

Background of Prior Art

It is well known to those skilled in the art that the deposition of germanium or silicon germanium by chemical vapor deposition is extremely sensitive relative to a receiving substrate. For example, germanium or silicon germanium deposition on a silicon substrate is relatively easy. On the other hand, germanium or silicon germanium deposition, heretofore, on silicon dioxide or metallic substrates has either required an extremely large incubation time (time-to-initiate deposition) with a resultant heterogeneous or lumpy deposition or would not deposit at all on some substrates at temperatures below 450° Celsius. Therefore it would be highly desirable to have a new and improved method of depositing amorphous germanium films on metallic or silicon dioxide substrates at temperatures less than 450° Celsius.

BRIEF SUMMARY OF THE INVENTION

In one preferred chemical vapor deposition method, a smooth continuous germanium film is deposited on a silicon seeded metallic substrate at a sufficiently low temperature to provide a germanium device suitable for integration with temperature sensitive materials such as aluminum and copper. In another preferred chemical vapor deposition method, a smooth continuous silicon germanium film is deposited on a seeded silicon dioxide substrate at a sufficiently low temperature to provide a germanium device suitable for use with temperature sensitive materials such as aluminum, copper and chalcogenides, such as $Ge_2Sb_2Te_5$.

BRIEF DESCRIPTION OF THE DRAWINGS

The above mentioned features and steps of the invention and the manner of attaining them will become apparent, and the invention itself will be best understood by reference to the following description of the preferred embodiment(s) of the invention in conjunction with the accompanying drawings wherein.

DETAILED DESCRIPTION OF THE PREFERRED EMBODIMENTS OF THE INVENTION

A method of germanium film deposition on metallic and silicon dioxide substrates is disclosed. The following description is presented to enable any person skilled in the art to make and use the invention. For purposes of explanation, specific nomenclature is set forth to provide a thorough understanding of the present invention. Descriptions of specific applications, and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

Figure 1:
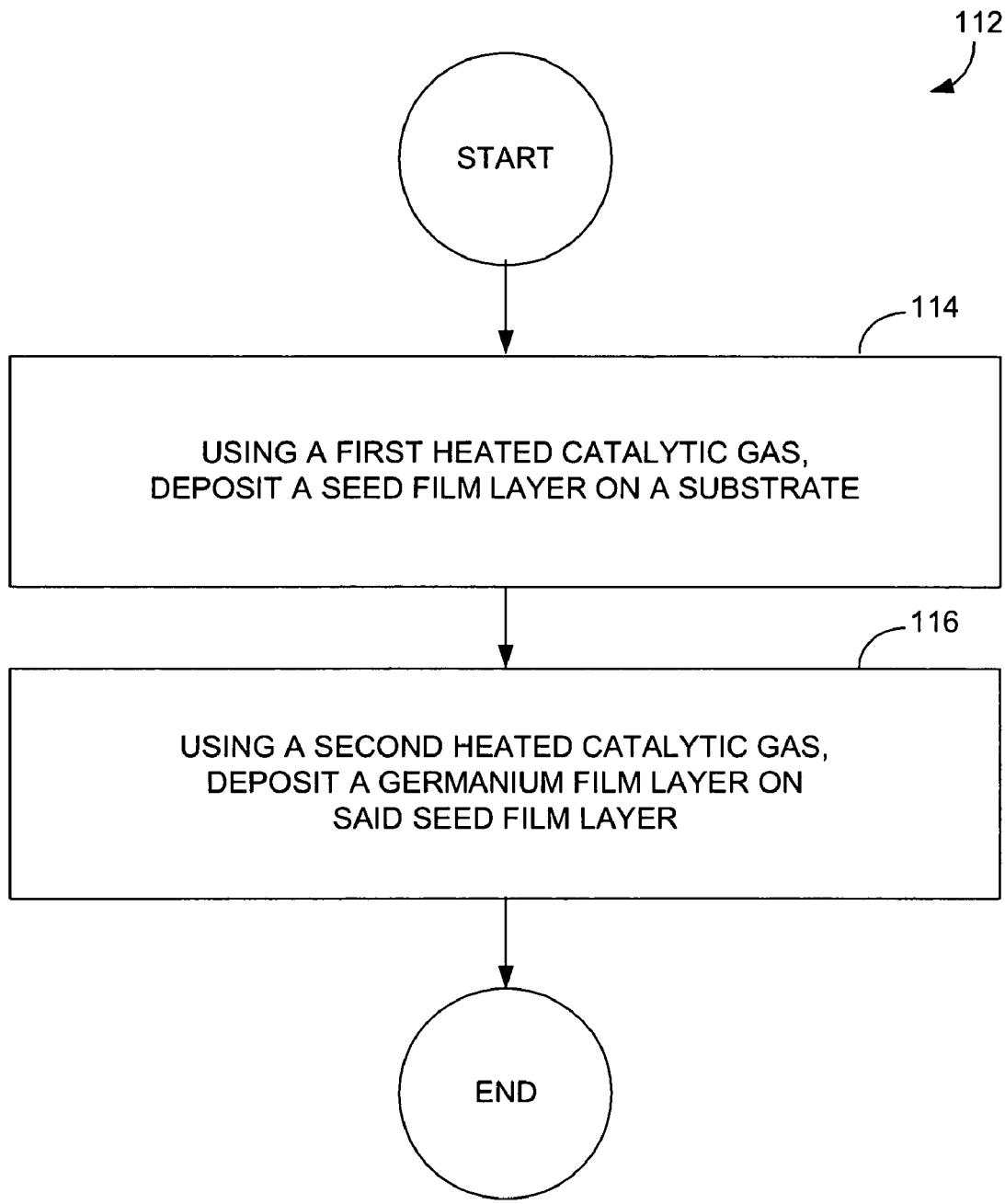
FIG. 1 is a diagrammatic flow chart illustrating a chemical vapor deposition method according to a preferred embodiment of the present invention.

Referring now to the drawings and more particularly to FIG. 1 thereof, there is shown a flow chart of a chemical vapor deposition method 112, which is in accordance with a preferred embodiment of the present invention. The disclosed method 112 enables the deposition of amorphous or polycrystalline germanium or silicon germanium homogenous films on silicon dioxide and metallic substrates at very low temperature of less than 320° C. by chemical vapor deposition. In this regard, this method applies to semiconductor devices, for example, for use in making memory devices, such as set forth in U.S. Patent Application Publication 20050012119, entitled, "Method for Making High Density Nonvolatile Memory," by S. B. Herner and M. Mahajani.

Before discussing the deposition method 112 in greater detail, it may be beneficial to briefly review the current state of the art for depositing germanium and silicon germanium (hereinafter individually and collectively sometimes referred to as simply Ge films) on dioxide or metallic substrates. In this regard, the standard method for depositing Ge films by chemical vapor deposition on a silicon dioxide substrate is to first deposit a thin silicon film as a seed layer. The silicon film seed layer is deposited to a predetermined minimized thickness to help minimize the impact on the electrical properties of the combined silicon and germanium or the combined silicon and silicon germanium film.

After deposition of the silicon seed layer, the Ge film layer is then deposited at an elevated temperature of something greater than 450° Celsius by chemical vapor deposition (CVD). The CVD method of depositing germanium using a $GeH_4$ precursor gas however has a disadvantage. That is, Ge films can have either a large incubation time (or time-to-initiate deposition) leaving the final film as heterogeneous or lumpy; or the Ge will not deposit at all on some substrates. This is caused by the difficulty of "cracking" the $GeH_4$ molecule to deposit germanium and remove hydrogen on some substrates. In this regard, it has been shown that it is difficult to deposit germanium (by $GeH_4$ catalysis) on $SiO_2$ substrates, while it is easier to deposit on silicon substrates.

The difficulty in silicon germanium deposition on a silicon dioxide substrate is well known in the art. Also, the method of using a silicon "seed" layer on a silicon dioxide substrate to help facilitate the silicon germanium deposit is well known. However, these silicon seed layer depositions are all performed at elevated temperature of greater than 500° Celsius, when using $SiH_4$ as a source for Si. For example, reference may be made to the following publication which is incorporated herein as though fully set forth: "Low Pressure Chemical Vapor Deposition of $Si_{1-x}Ge_x$ Films On $SiO_2$," by M. Cao, A. Wang, K. C. Saraswat, Journal of the Electrochemical Society 142, 1566-1572 (1995).

Considering now the deposition method 112 in greater detail with reference to FIG. 1, the process begins at a using step 114, which causes a first catalytic gas source, such as a silicon gas source, to flow across a substrate, such as a metallic substrate for the purpose of depositing a seed film of silicon on the substrate. Next, a using step 116 causes a second catalytic gas source, such as a germanium gas source, to flow across the seeded substrate for the purpose of depositing a germanium film on the seed layer of silicon. As will be explained hereinafter in greater detail, because of the type of silicon gas employed and temperature used, the seed layer of silicon is a self-limited seed layer. This means that the reaction proceeds to deposit silicon until full coverage of the exposed underlying layer is achieved. This results in a thin layer, for example, which could be one to three atoms in thickness. Moreover, because the second catalytic gas is delivered at a sufficiently low temperature (320° C. or lower) the metallic substrate with the film layers deposited thereon, are suitable for use with other temperature sensitive materials that would otherwise be precluded by higher temperature deposition of germanium or silicon-germanium by other methods.

In short then, the self-limited silicon seed layer is formed using an inexpensive, widely available precursor gas, enabling Ge deposition on the substrate at much lower temperatures (<320° C.) than known in the prior art. Such low temperature deposition in turn, enables the use of thermally sensitive materials, such as aluminum wiring, chalcogenide memory materials, and copper as examples, that would be precluded by higher temperature Si or SiGe deposition (>475° C.). The self-limited feature also minimizes the Si deposition, therefore, minimizing Si impact on the resulting device, which is desirable. Finally, all of these advantages, over the prior art, are accomplished without the use of special expensive gases.

Considering now the deposition method 112 in still greater detail, the deposition method of depositing Ge films on metallic and dioxide substrates enables integration with other temperature sensitive materials, such as Aluminum (Al) and Copper (Cu) wiring. Also the method 112, utilizes a lower temperature $SiH_4$ catalysis for cracking on Titanium nitride (TiN) to produce a self limited layer of silicon (~4 Å). The use of such a seed layer for a Ge film deposition is unique and novel. Moreover, minimizing the thickness of the silicon seed is very advantageous, and self-limitation is inherently more manufacturable since it is subject to less operator errors.

The deposition method 112, as will be explained hereinafter in greater detail, provides a novel process for deposition of Ge films on, for example, TiN or $SiO_2$ substrates at temperatures below 330° Celsius. After deposition of the amorphous Ge film at 330° C. (or less), the Ge film is crystallized in a subsequent step. Crystallization of the Ge film takes place at a temperature of between about 350° C. and about 425° C. By depositing the film amorphous and then, at a later step, heating the amorphous Ge film for a sufficient period of time to cause the film to crystallize so that crystallized semiconductor device performance is improved compared to depositing the film crystalline. By keeping the temperature at 425° C. or less for Ge processing, Ge semiconductor devices can be integrated with other thermally sensitive materials, such as aluminum interconnect or chalcogenides memory materials. It should be recognized however, by those skilled in the art, that this does not preclude the use of the Ge film as a semiconductor in its amorphous state.

Figure 24:
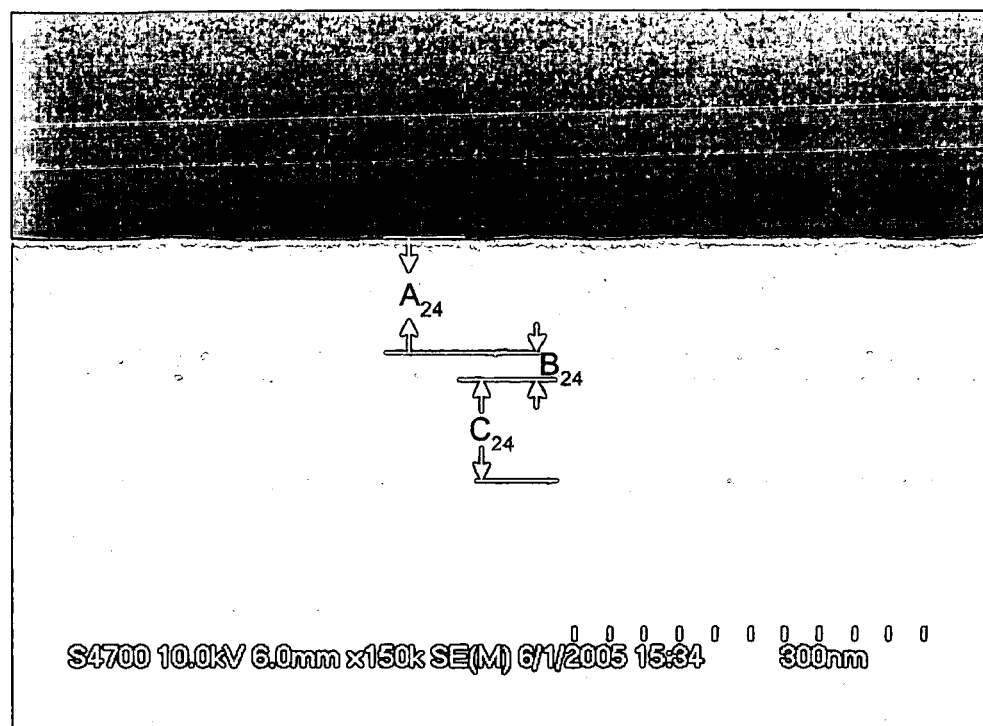
FIG. 24 is a photo of a TiN substrate, which has been subjected to a chemical vapor deposition process in accordance with a preferred embodiment of the present invention.
Figure 25:
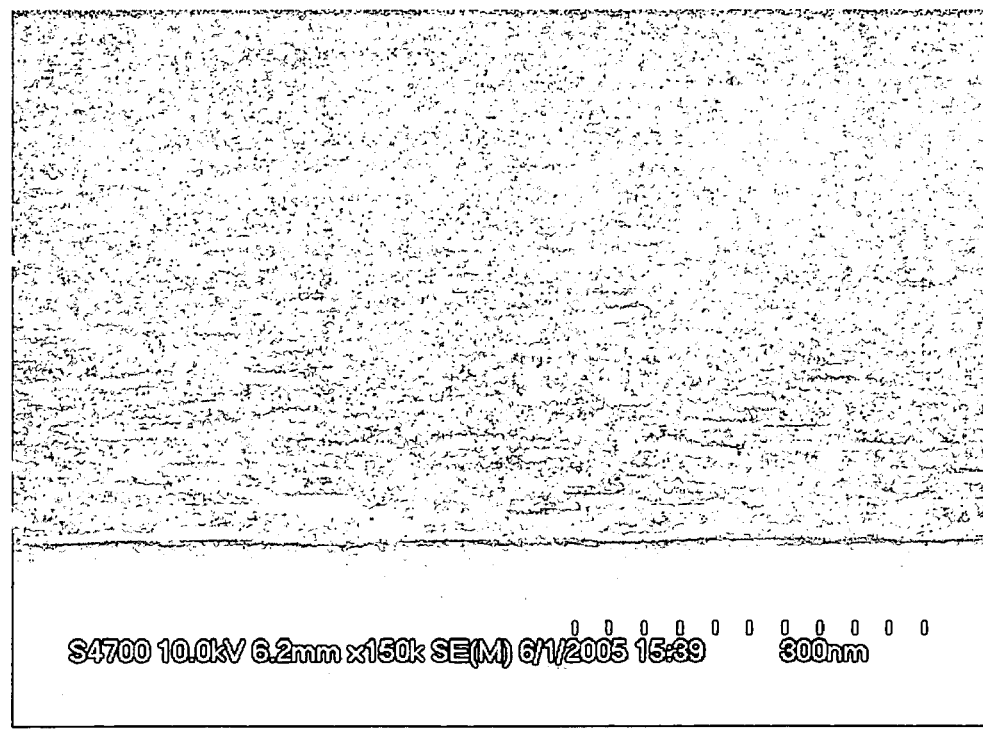
FIG. 25 is a photo of a TiN substrate, which has been subjected to the chemical vapor deposition process mentioned relative to FIG. 24.

In order to provide the reader with a better understanding of the benefits derived from the inventive chemical vapor disposition process, a series of scanning electronic microscope (SEM) photographs or images are provided (FIGS. 2-3 and FIGS. 5-23). In each of the SEM photographs, the silicon seed layer is not visible. In this regard, when a silicon film is indicated, the silicon film has been deposited in a separate deposition. In the inventive process 112, as illustrated in FIGS. 24-25, a $SiO_2$ layer $C_{24}$ and a Ge film layer $A_{24}$ are deposited in one deposition (two steps). It should be noted that a Si seed layer exists between the Ge film $A_{24}$ and the TiN film $B_{24}$ but the Si seed layer is not visible.

Figure 2:
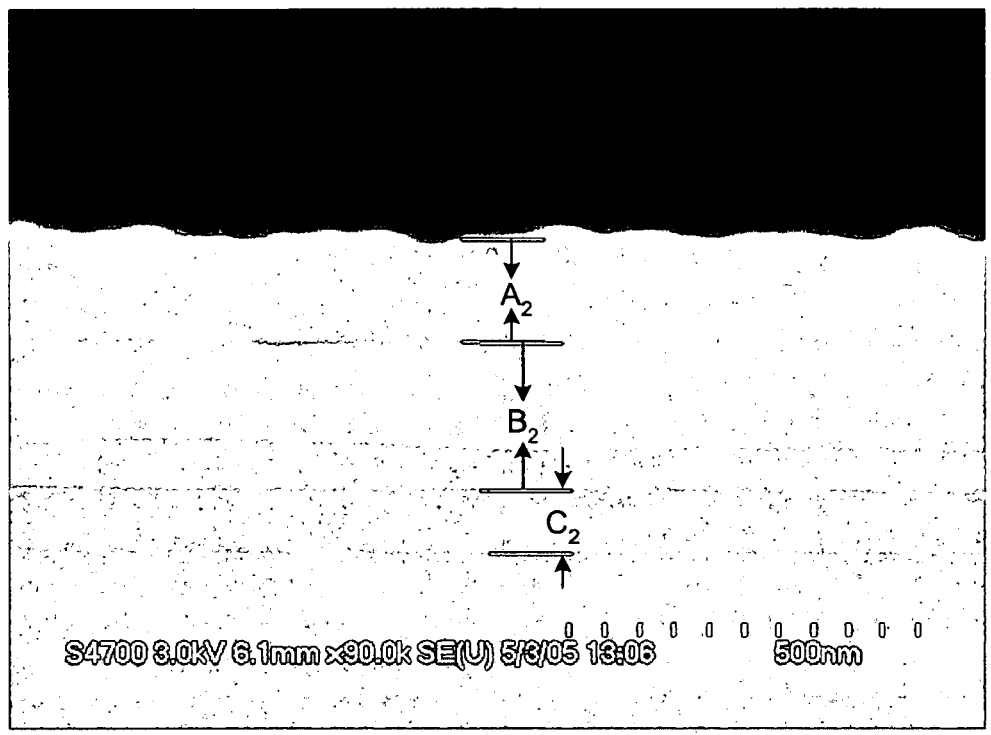
FIG. 2 is a photo of an α silicon substrate, with no seed layer, which has been subjected to a chemical vapor deposition process using a catalytic gas of $GeH_4$ at an elevated temperature of about 400° Celsius.
Figure 3:
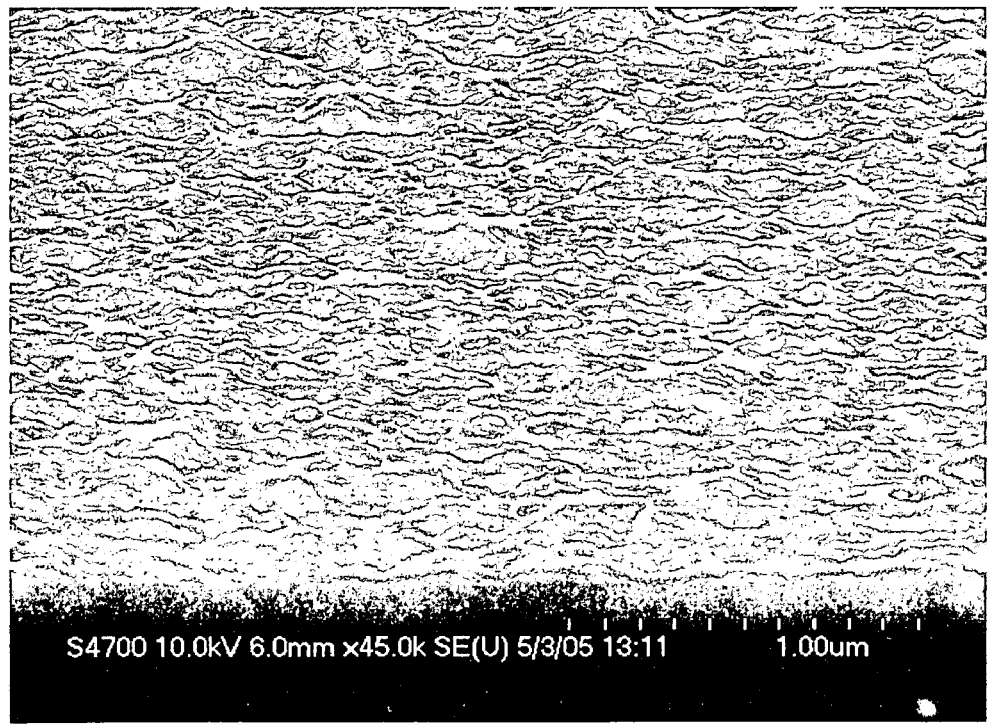
FIG. 3 is a photo of an α silicon substrate after being subjected to the chemical vapor deposition process mentioned relative to FIG. 2.
Figure 4:
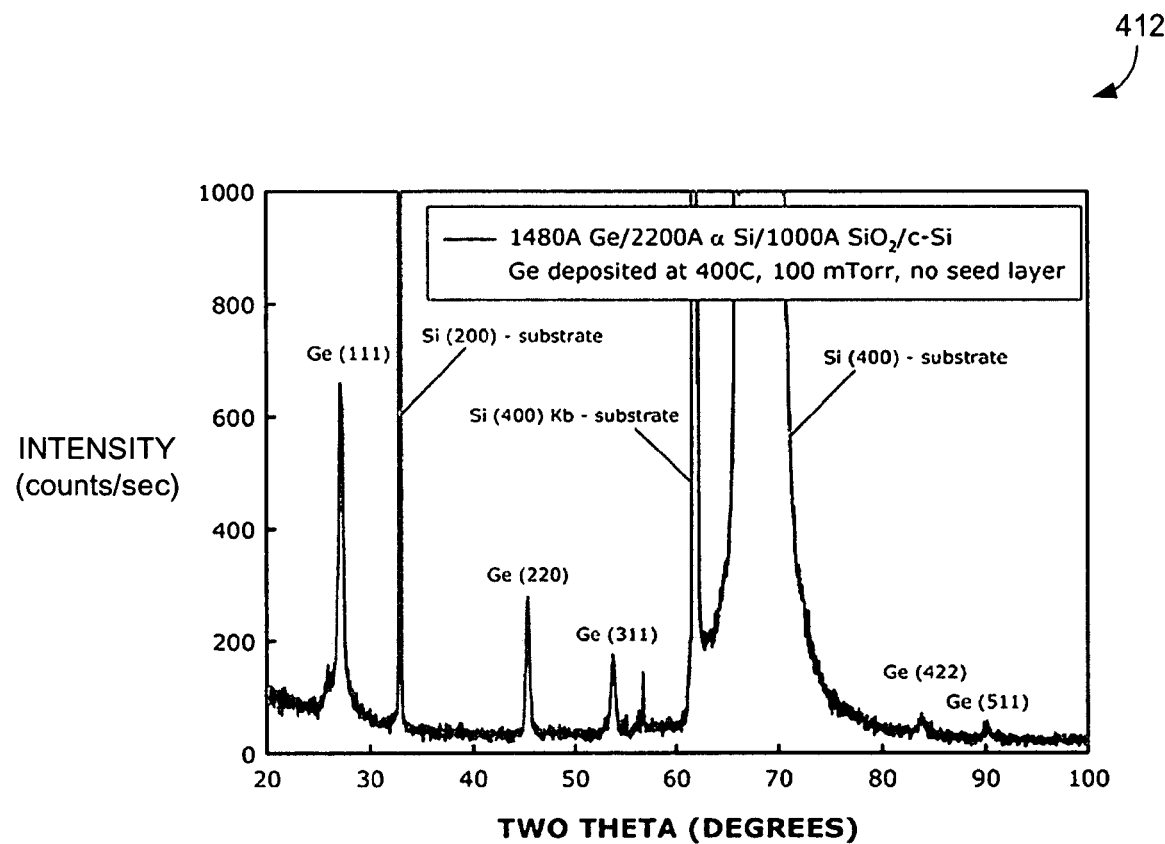
FIG. 4 is an x-ray diffraction graph illustrating that the deposited germanium film layer as shown in FIG. 2 is polycrystalline.

Referring now to FIGS. 2 and 3, there is provided a set of scanning electronic microscope photographs that illustrate the results of a germanium deposition at 400° Celsius, utilizing a 100 standard cubic centimeter per minute flow rate of $GeH_4$ gas, delivered at a pressure of 100 mTorr, for a 30 minute period on a 220 nanometer a silicon substrate 12 with no seed layer. In this regard, there is shown a resulting germanium film layer $A_2$ with a depth of about 0.1480 µm, a separately deposited silicon film layer $B_2$ with a depth of about 0.2180 µm of doped and undoped silicon, which has been deposited on a layer $C_2$ of silicon dioxide, has a depth of about 0.0910 µm. As best seen in FIG. 4, an x-ray diffraction graph 412, clearly confirms that the deposited Ge film is polycrystalline. It was also determined by SEM imaging, although not shown in separate photographs, that with both a $SiO_2$ substrate and a TiN substrate, no deposition occurred relative to the condition mentioned.

Figure 5:
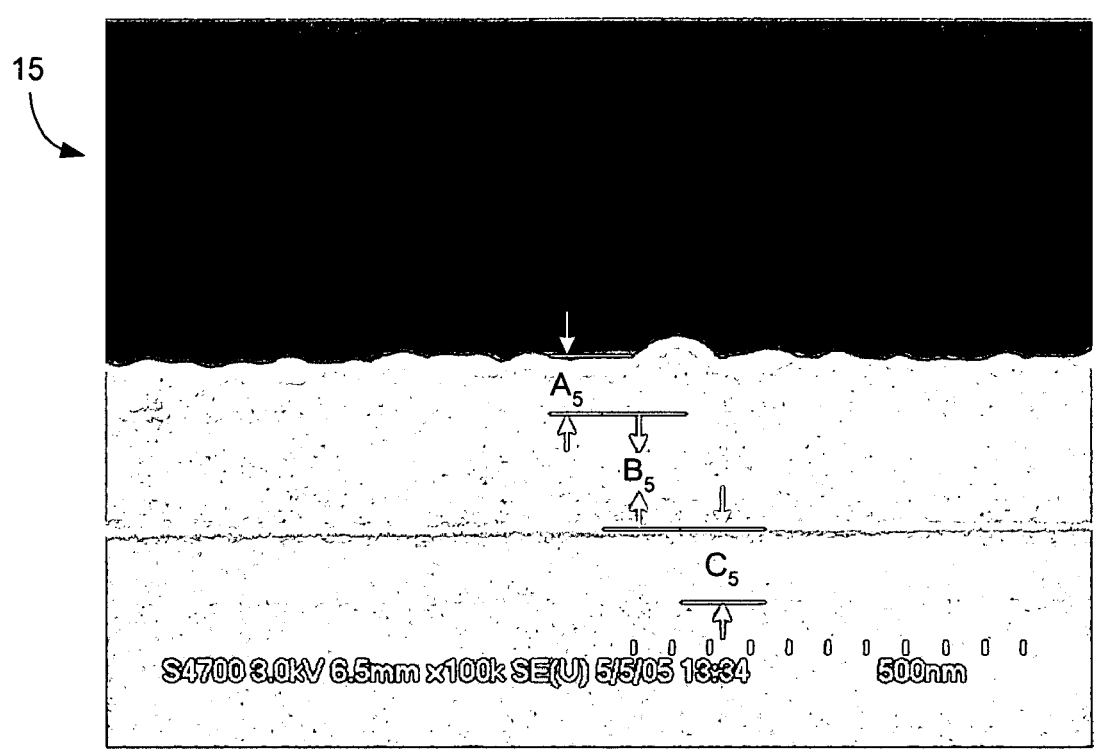
FIG. 5 is a photo of an α silicon substrate, which has been subjected to a chemical vapor deposition process at an elevated temperature of about 380° Celsius.
Figure 6:
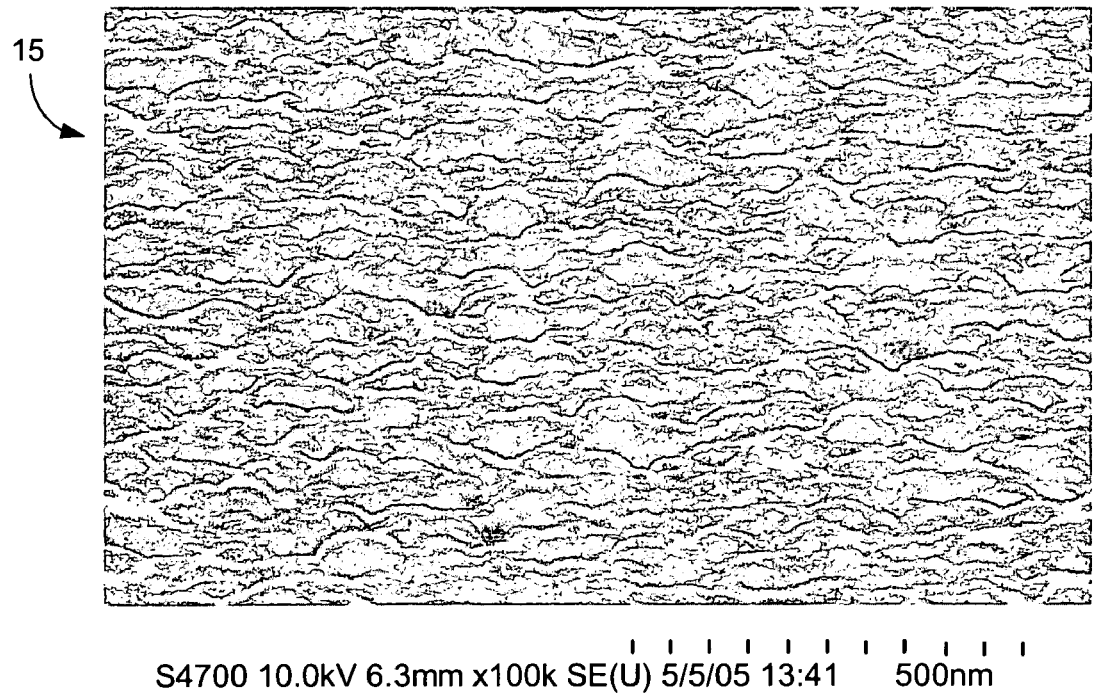
FIG. 6 is a photo of an α silicon substrate after being subjected to the chemical vapor deposition process mentioned relative to FIG. 5.

Referring now to FIGS. 5-6, there is provided a set of photographs which illustrate the results of a germanium deposition at 380° Celsius, utilizing a 500 standard cubic centimeter per minute flow rate of $SiH_4$ gas, delivered at a pressure of 400 mTorr, for a 60 minute period on an a silicon substrate 15. In this regard, there is shown a resulting germanium film layer $A_5$ with a depth of about 0.0750 µm, a separately deposited silicon film layer $B_5$ with a depth of about 0.1510 µm, which has been deposited on a silicon dioxide layer $C_5$ having a depth of about 0.0950 µm.

Figure 7:
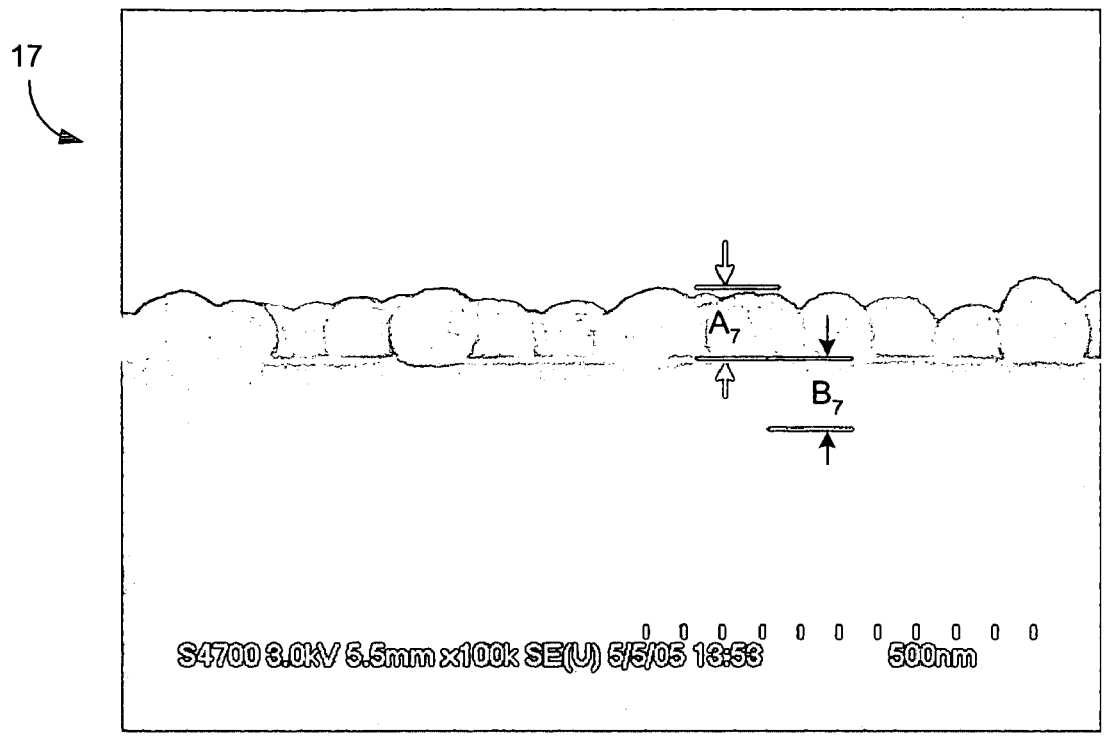
FIG. 7 is a photo of a silicon dioxide substrate, which has been subjected to a chemical vapor deposition process at an elevated temperature of about 380° Celsius.
Figure 8:
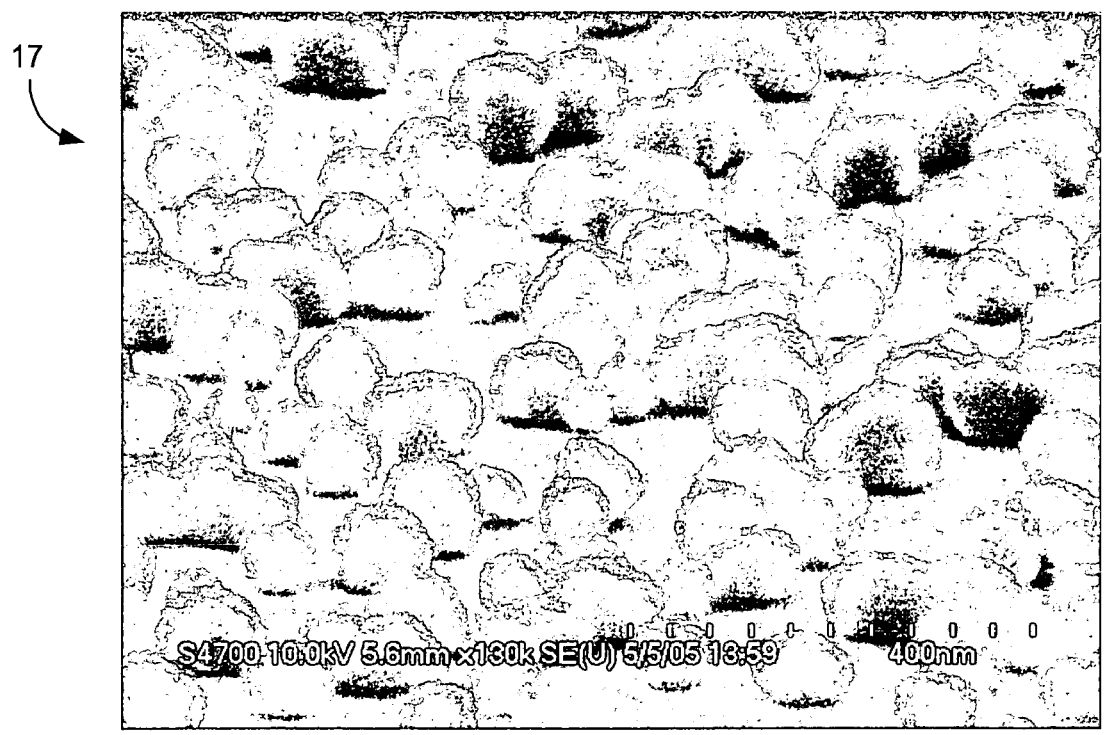
FIG. 8 is a photo of a silicon dioxide substrate after being subjected to the chemical vapor deposition process mentioned relative to FIG. 7.

Referring now to FIGS. 7-8, there is provided a set of photographs which illustrates the results of a germanium deposition at 380° C., utilizing a 100 standard cubic centimeter per minute flow rate of $GeH_4$ gas, delivered at a pressure of 200 mTorr, for a 10 minute period on a silicon dioxide substrate 17. In this regard, there is shown a resulting germanium film layer $A_7$ with a depth of about 0.0930 µm, a separately deposited $SiO_2$ film layer $B_7$ with a depth of about 0.0930 µm. It was also determined by SEM imaging, although not shown in a separate photograph, that with a TiN substrate, no deposition occurred relative to the condition mentioned.

Figure 9:
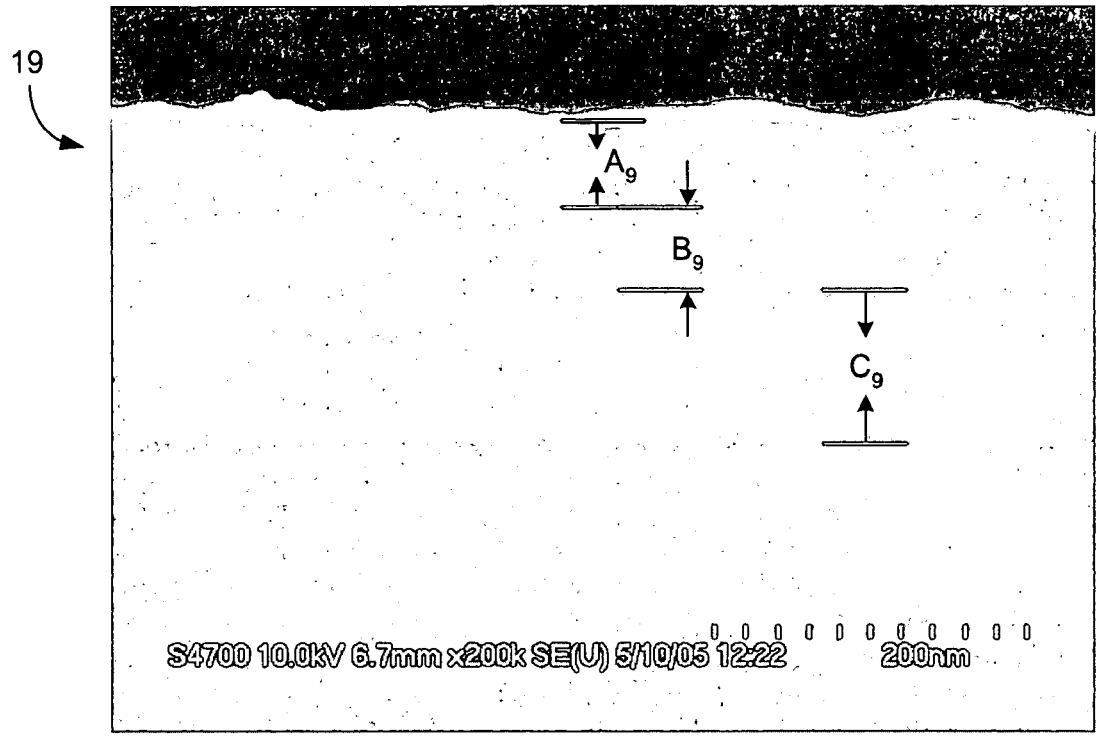
FIG. 9 is a photo of an α silicon substrate, which has been subjected to a chemical vapor deposition process at an elevated temperature of about 380° Celsius.
Figure 10:
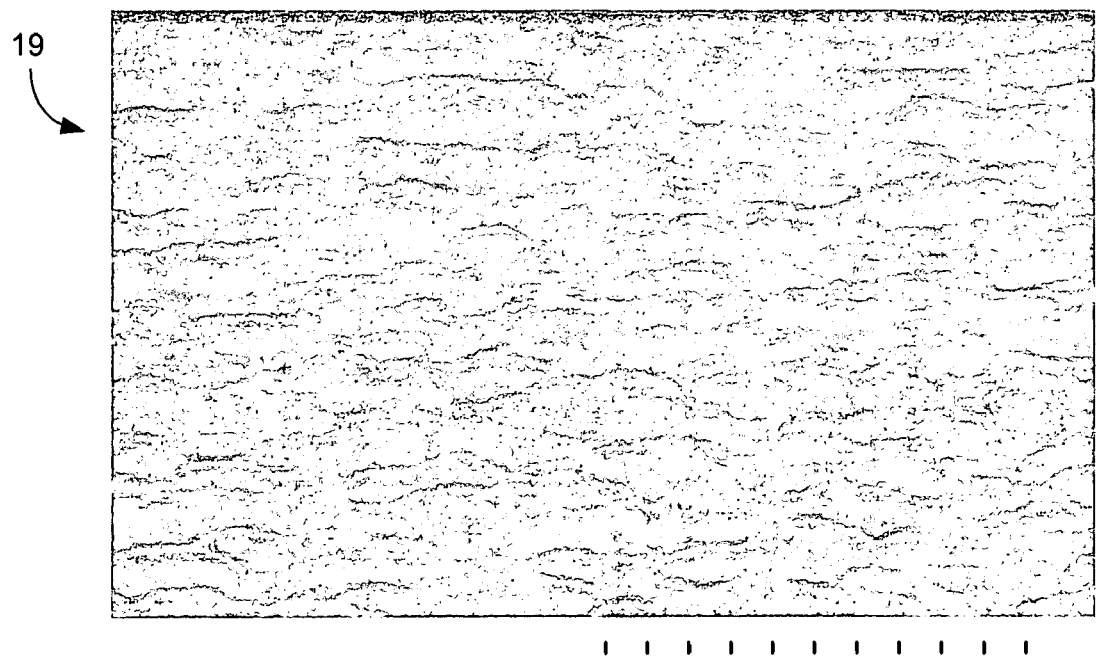
FIG. 10 is a photo of an α silicon substrate, which has been subjected to a chemical vapor deposition process mentioned relative to FIG. 9.

Referring now to FIGS. 9-10, there is provided a set of photographs which illustrates the results of a germanium deposition at 380° Celsius, utilizing a 500 standard cubic centimeter per minute flow rate of $SiH_4$ gas, delivered at a pressure of 800 mTorr, for a 60 minute period on an a silicon substrate 19. In this regard, there is shown a resulting germanium film layer $A_9$ with a depth of about 0.0570 µm, a resulting silicon film layer $B_9$ with a depth of about 0.0530 µm. which is deposited on a silicon diode layer $C_9$ with a depth of about 0.1000 µm.

Figure 11:
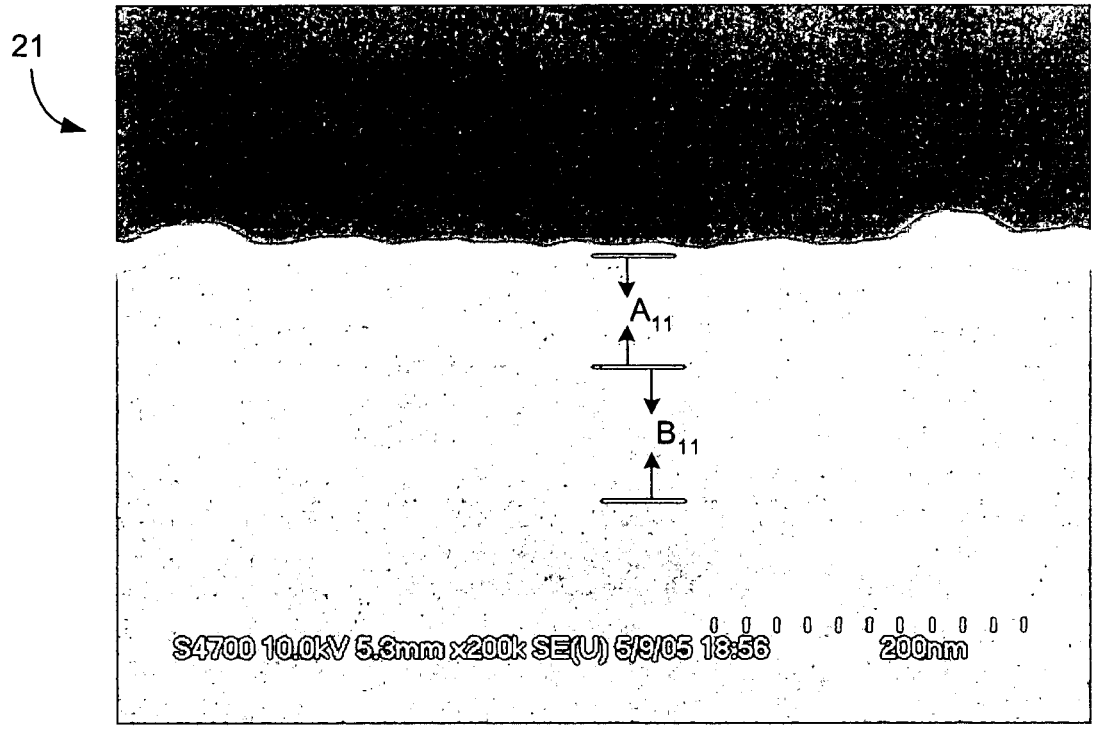
FIG. 11 is a photo of a silicon dioxide, which has been subjected to a chemical vapor deposition process at an elevated temperature of about 380° Celsius.

Referring now to FIG. 11, there is provided a photograph which illustrates the results of a germanium deposition at 380° Celsius., utilizing a 100 standard cubic centimeter per minute flow rate of $GeH_4$ gas, delivered at a pressure of 400 mTorr, for a 10 minute period on a $SiO_2$ substrate 21. In this regard, there is shown a resulting germanium film layer $A_{11}$ with a depth of about 0.0730 µm, and a resulting $SiO_2$ film layer $B_{11}$ with a depth of about 0.0880 µm, on the $SiO_2$ substrate layer 21.

Figure 12:
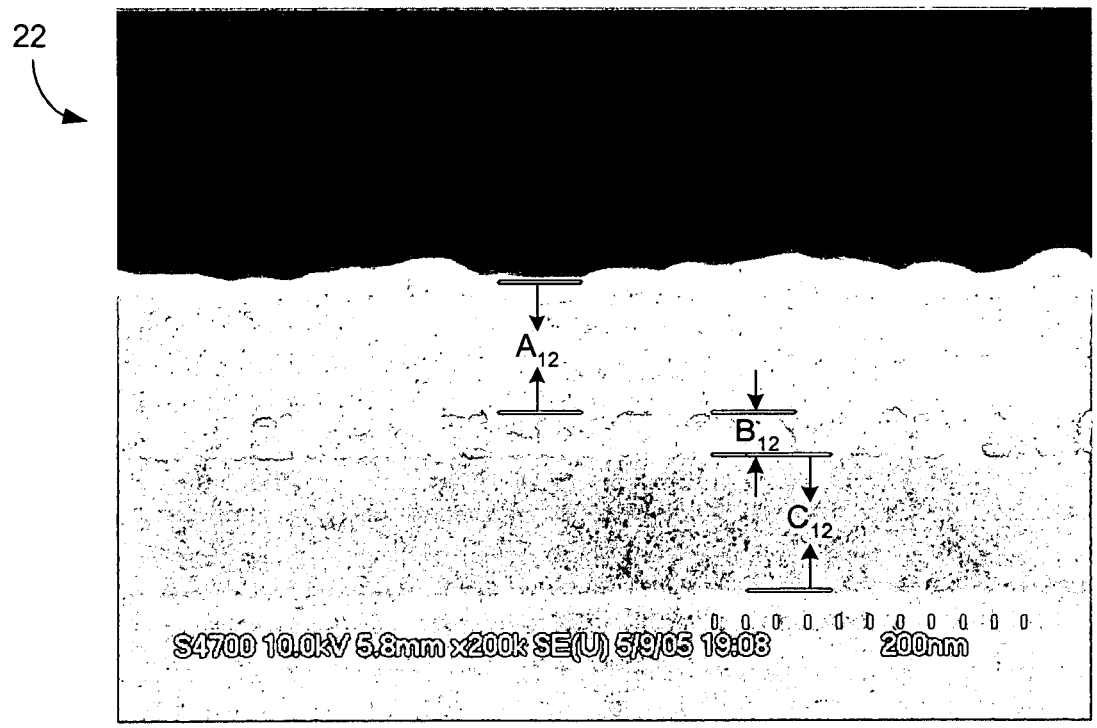
FIG. 12 is photo of a TiN substrate, which has been subjected to a chemical vapor deposition process at an elevated temperature of about 380° C.

Referring now to FIG. 12, there is provided a photograph which illustrates the results of a germanium deposition at 380° Celsius, utilizing a 100 standard cubic centimeter per minute flow rate of $GeH_4$ gas, delivered at a pressure of 400 mTorr, for a 10 minute period on a TiN substrate 22. In this regard, there is shown a resulting germanium film layer $A_{12}$ with a depth of about 0.0860 µm, and a resulting TiN film layer $B_{12}$ with a depth of about 0.0290 µm, which has been deposited on a silicon dioxide layer $C_{12}$ with a depth of about 0.0900 µm.

With respect to FIGS. 9-12 it can be seen that the increased pressure during the silicon-seeding phase better enabled Ge deposition on both the $SiO_2$ substrate 19 and the TiN substrate 22.

Figure 13:
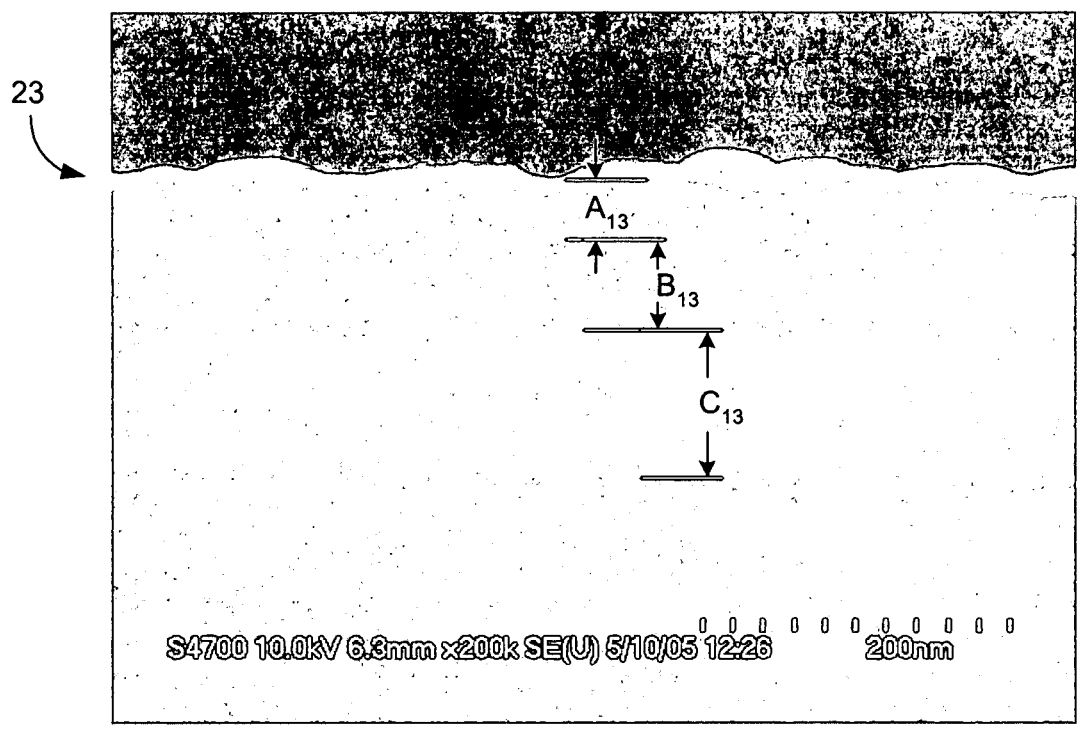
FIG. 13 is a photo of an α silicon substrate, which has been subjected to a chemical vapor deposition process at an elevated temperature of about 360° Celsius.
Figure 14:
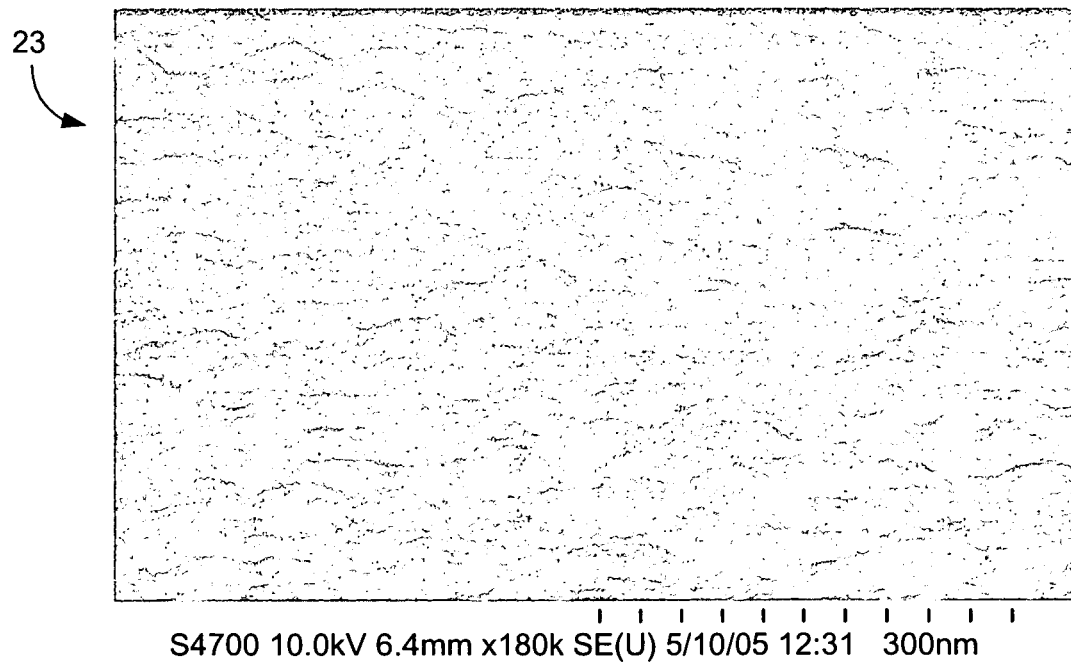
FIG. 14 is a photo of an α silicon substrate, which has been subjected to the chemical vapor deposition process mentioned relative to FIG. 13.

Referring now to FIGS. 13-14, there is provided a set of photographs which illustrate the results of a germanium deposition at 360° Celsius, utilizing a 500 standard cubic centimeter per minute flow rate of $SiH_4$ gas, delivered at a pressure of 800 mTorr, for a 60 minute period on an a silicon substrate 23. In this regard, there is shown a resulting germanium film layer $A_{13}$ with a depth of about 0.0400 µm, a resulting silicon film layer $B_{13}$ with a depth of about 0.0600 µm, which has been deposited on a silicon dioxide layer $C_{13}$ with a depth of about 0.0990 µm.

Figure 15:
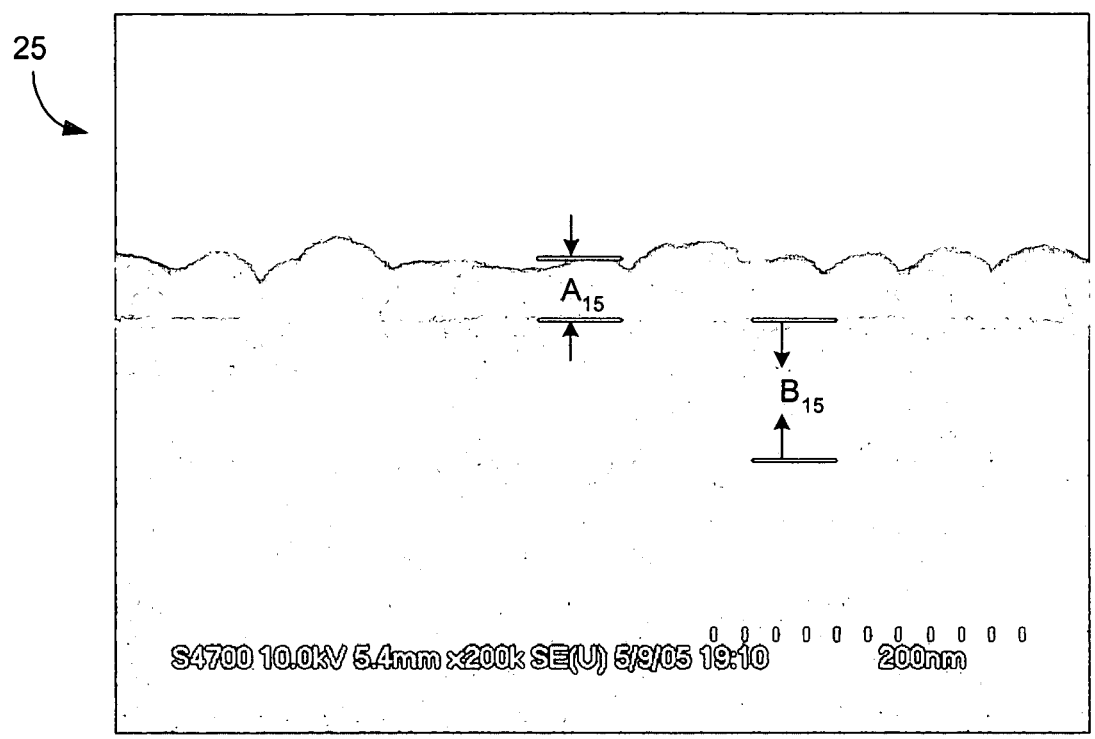
FIG. 15 is a photo of a silicon dioxide substrate, which has been subjected to a chemical vapor deposition process at an elevated temperature of about 360° Celsius.

Referring now to FIG. 15, there is provided a photograph which illustrates the results of a germanium deposition at 360° Celsius, utilizing a 100 standard cubic centimeter per minute flow rate of $GeH_4$ gas, delivered at a pressure of 400 mTorr, for a 10 minute period on a $SiO_2$ substrate 25. In this regard, there is shown a resulting germanium film layer $A_{15}$ with a depth of about 0.0410 µm, and a resulting $SiO_2$ film layer $B_{15}$ with a depth of about 0.0930 µm, on the $SiO_2$ substrate layer 25.

Figure 16:
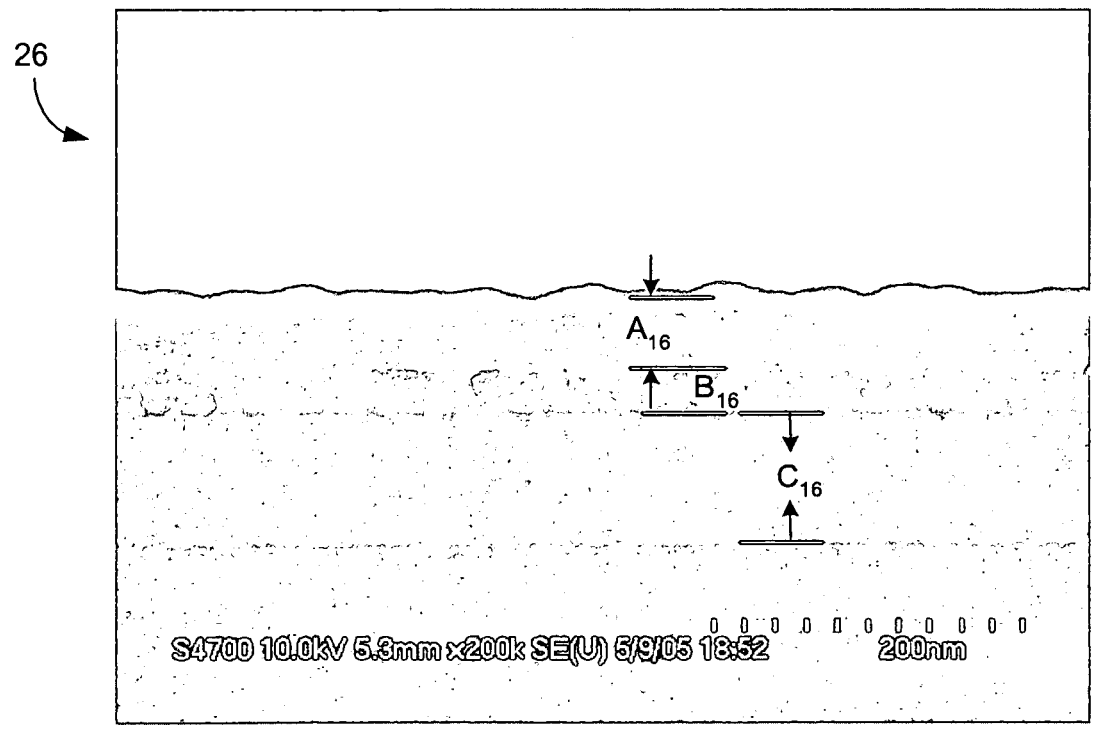
FIG. 16 is a photo of a TiN substrate, which has been subjected to a chemical vapor deposition process at an elevated temperature of about 360° Celsius.

Referring now to FIG. 16, there is provided a photograph which illustrates the results of a germanium deposition at 360° Celsius, utilizing a 100 standard cubic centimeter per minute flow rate of $GeH_4$ gas, delivered at a pressure of 400 mTorr, for a 10 minute period on a TiN substrate 26. In this regard, there is shown a resulting germanium film layer $A_{16}$ with a depth of about 0.0470 µm, and a resulting TiN film layer $B_{16}$ with a depth of about 0.0300 µm, which has been deposited on a silicon dioxide layer $C_{16}$ with a depth of about 0.0860 µm.

With respect to FIGS. 13-16 it can be seen that the decrease in temperature degraded the Ge film deposition on the $SiO_2$ substrate since the $SiH_4$ decomposition is most likely becoming less effective at providing a seed layer that fully covers the substrate at the lower temperature. It can also be seen that the Ge films are poly-crystalline so there is a need to further decrease the deposition to have a resulting amorphous Ge film.

Figure 17:
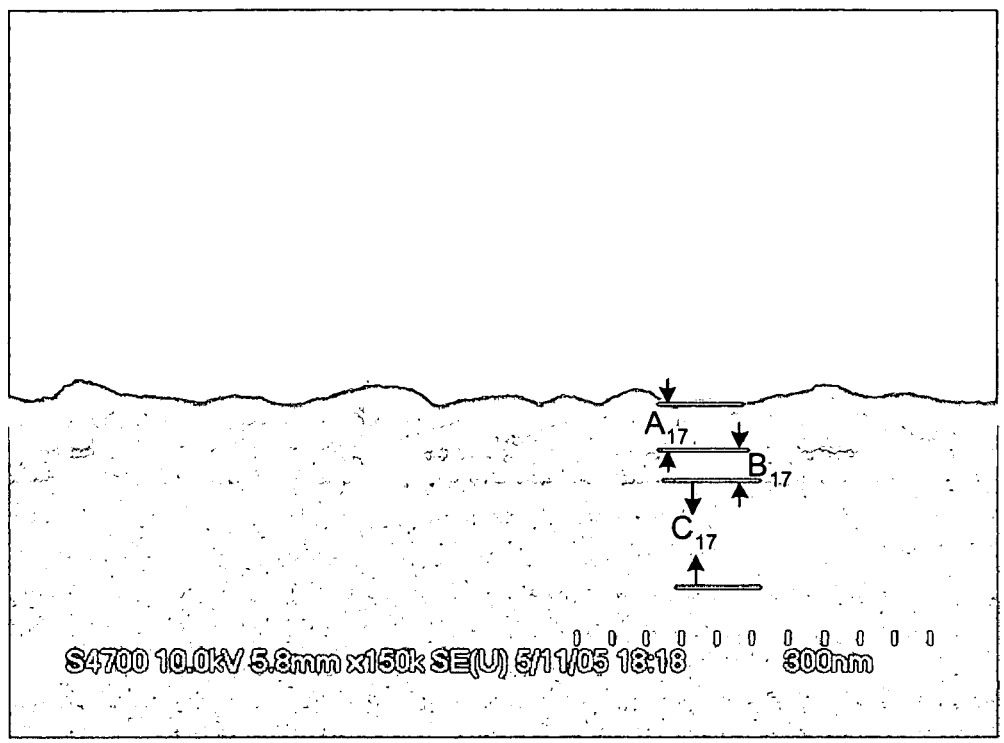
FIG. 17 is a photo of an α silicon substrate, which has been subjected to a chemical vapor deposition process at an elevated temperature of about 340° Celsius.
Figure 18:
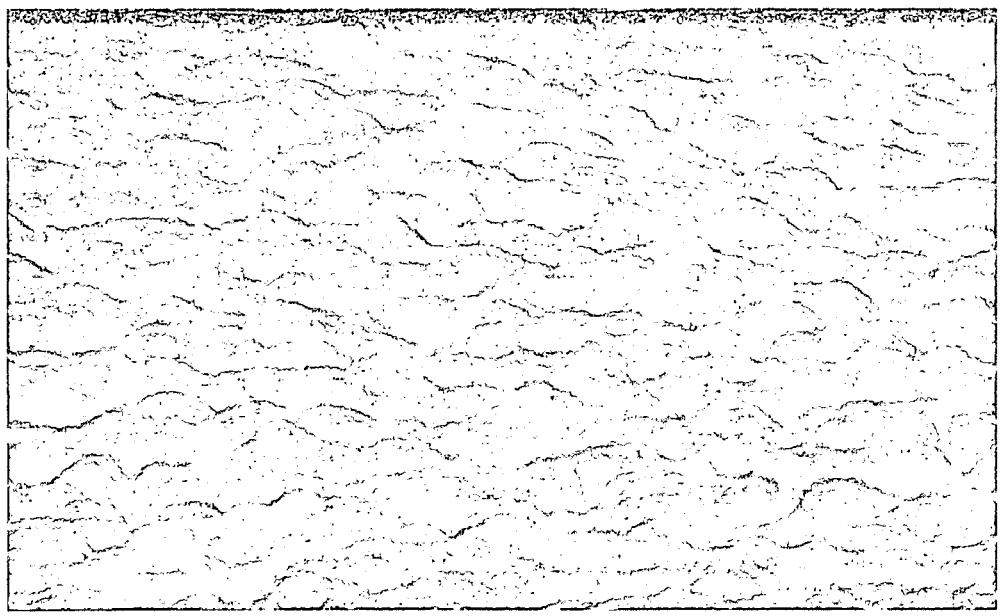
FIG. 18 is a photo of an α silicon substrate, which has been subjected to the chemical vapor deposition process mentioned relative to FIG. 17.

Referring now to FIGS. 17-18, there is provided a set of photographs which illustrate the results of a germanium deposition at 340° Celsius, utilizing a 500 standard cubic centimeter per minute flow rate of $SiH_4$ gas, delivered at a pressure of 800 mTorr, for a 60 minute period on an a silicon substrate 27. In this regard, there is shown a resulting germanium film layer $A_{17}$ with a depth of about 0.0400 µm, a separately deposited silicon film layer $B_{17}$ with a depth of about 0.0260 µm, which has been deposited on a silicon dioxide layer $C_{17}$ with a depth of about 0.0930 µm. This process results in a Ge film deposit rate of about 40 Å per minute.

Figure 19:
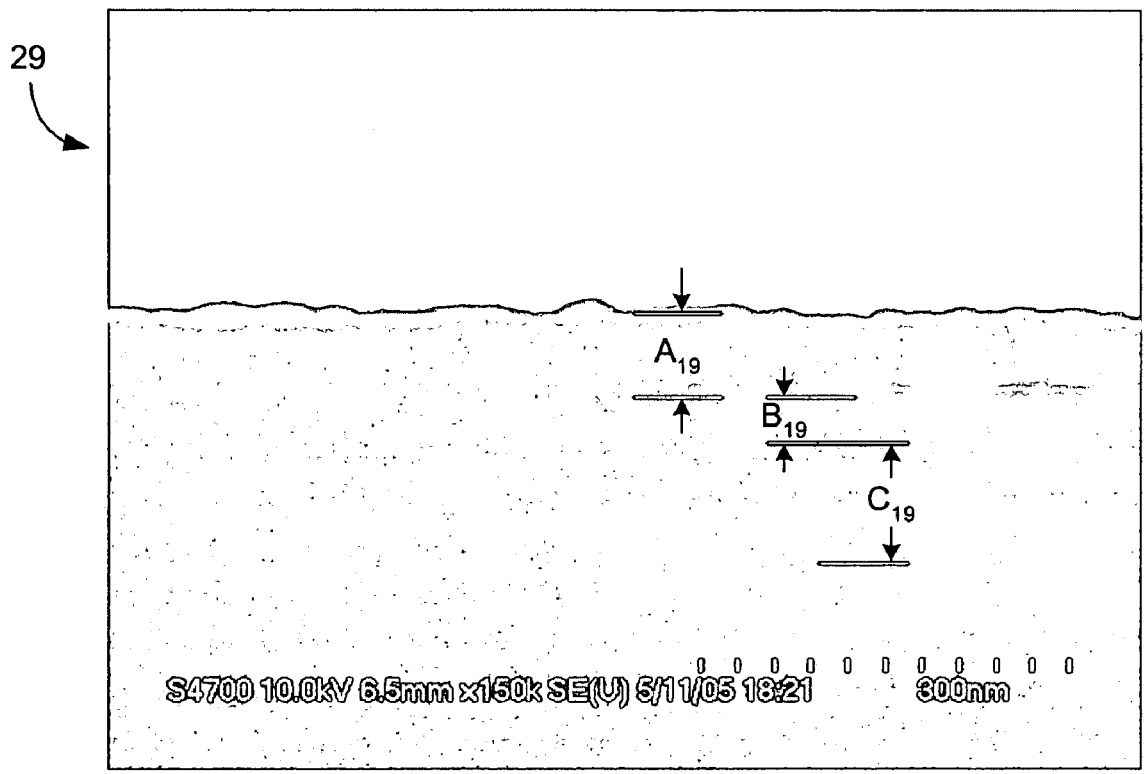
FIG. 19 is a photo of a TiN substrate, which has been subjected to a chemical vapor deposition process at an elevated temperature of about 340° Celsius.

Referring now to FIG. 19, there is provided a photograph which illustrates the results of a germanium deposition at 340° Celsius, utilizing a 100 standard cubic centimeter per minute flow rate of $GeH_4$ gas, delivered at a pressure of 800 mTorr, for a 10 minute period on a TiN substrate 29. In this regard, there is shown a resulting germanium film layer $A_{19}$ with a depth of about 0.0700 µm, a resulting TiN film layer $B_{19}$ with a depth of about 0.0380 µm, which has been deposited on a silicon dioxide layer $C_{19}$ with a depth of about 0.1010 µm. This process results in a Ge film deposit rate of about 70 Å per minute. It was also determined by SEM imaging, although not shown in a separate photograph, that with a $SiO_2$ substrate, no deposition occurred relative to the condition mentioned.

With respect to FIGS. 17-19 it can be seen that the decrease in temperature has now completely failed to deposit a Ge film the $SiO_2$ substrate. Moreover, even the Ge film deposition on the TiN substrate has degraded. It can also be seen that the silicon film and the germanium film are still polycrystalline, so there is still a need to further decrease the deposition to have a resulting amorphous Ge film.

Figure 20:
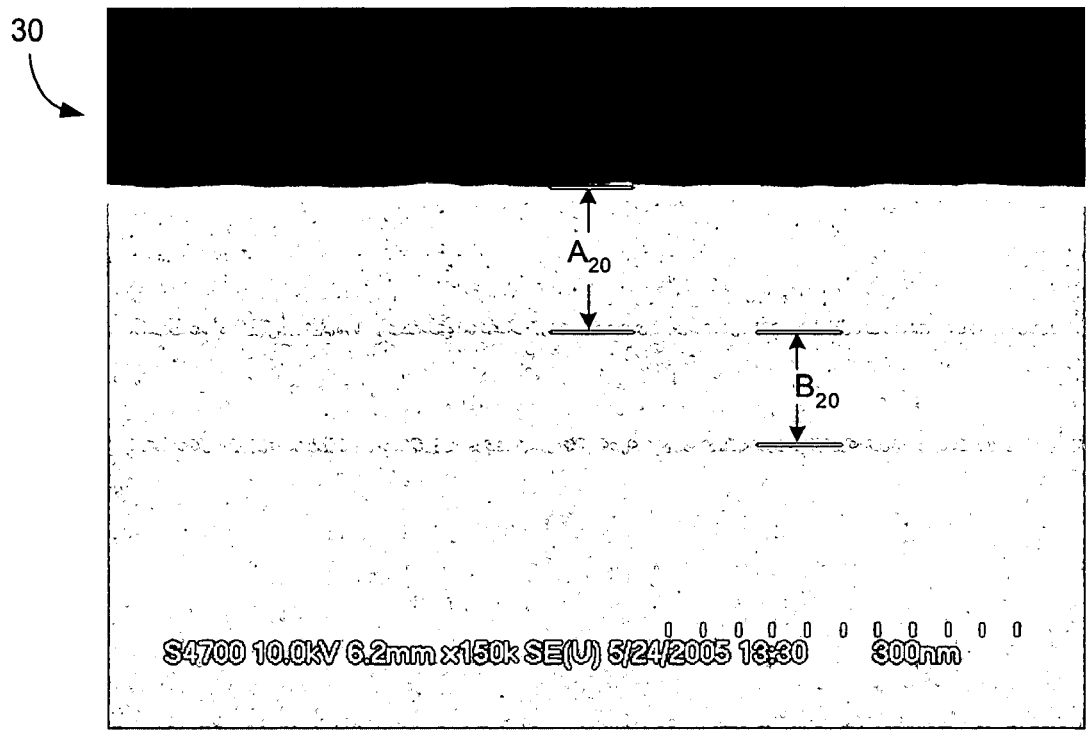
FIG. 20 is a photo of an α silicon substrate, which has been subjected to a chemical vapor deposition process at an elevated temperature of about 320° Celsius.
Figure 21:
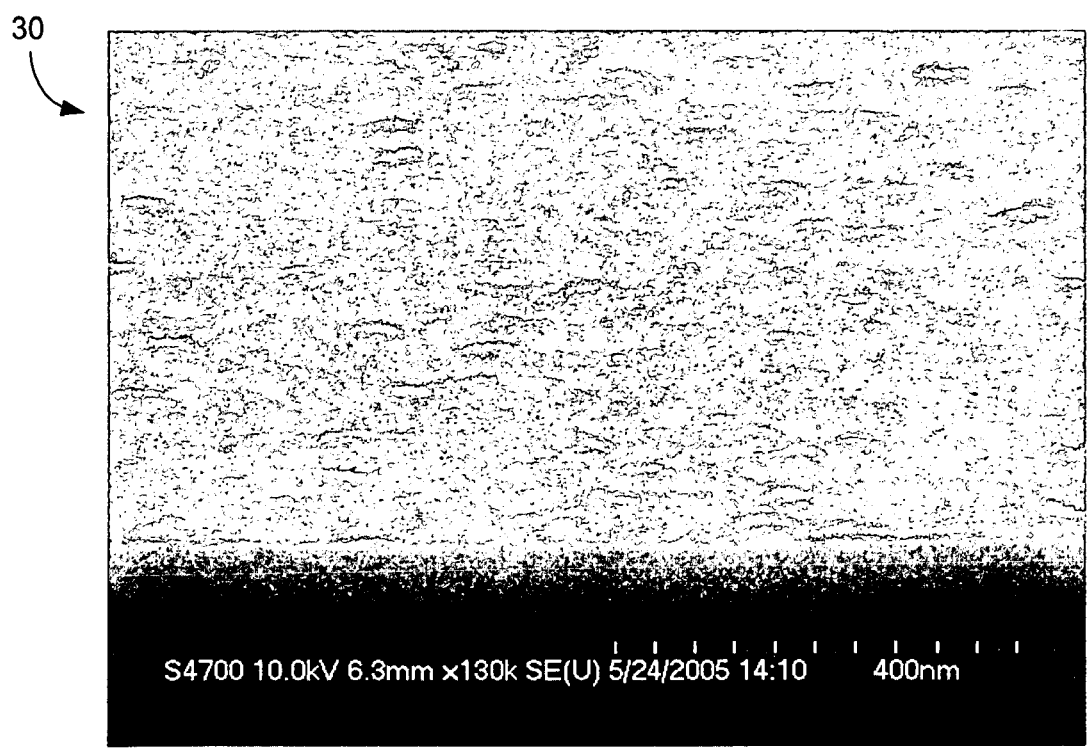
FIG. 21 is a photo of an α silicon substrate, which has been subjected to the chemical vapor process mentioned relative to FIG. 20.

Referring now to FIGS. 20-21, there is provided a set of photographs which illustrates the results of a germanium deposition at 320° Celsius, utilizing a 500 standard cubic centimeter per minute flow rate of $SiH_4$ gas, delivered at a pressure of 1000 mTorr, for a 60 minute period on an α silicon substrate 30. In this regard, there is shown a resulting germanium film layer $A_{20}$ with a depth of about 0.1280 μm, and a separately deposited silicon film layer $B_{20}$ with a depth of about 0.0980 μm, on the α silicon substrate 30.

Figure 22:
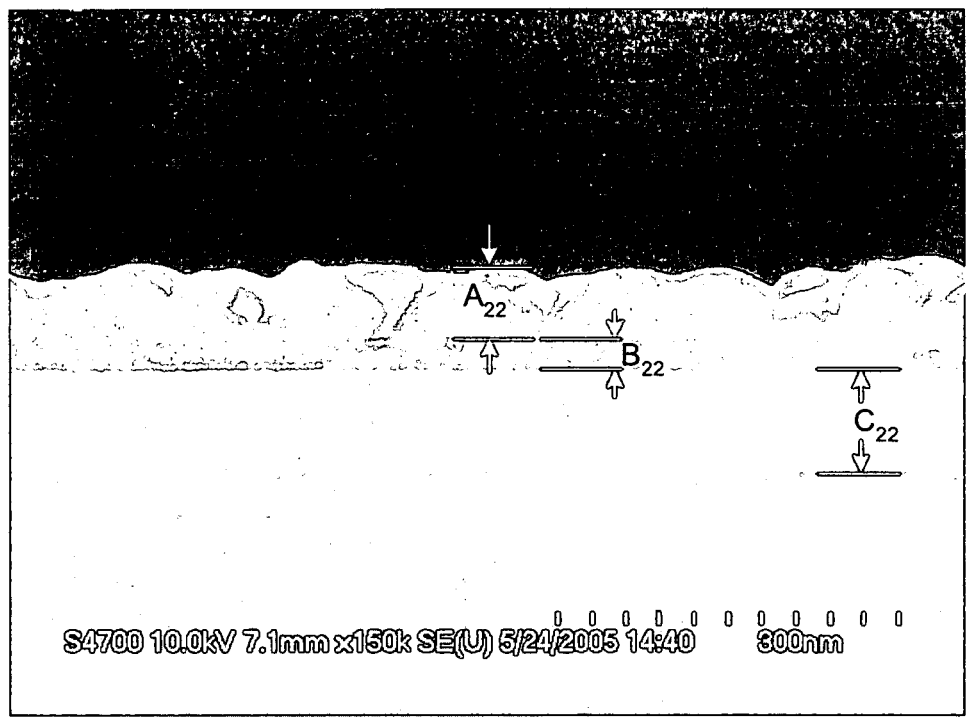
FIG. 22 is a photo of a TiN substrate, which has been subjected to a chemical vapor deposition process at an elevated temperature of about 320° Celsius.
Figure 23:
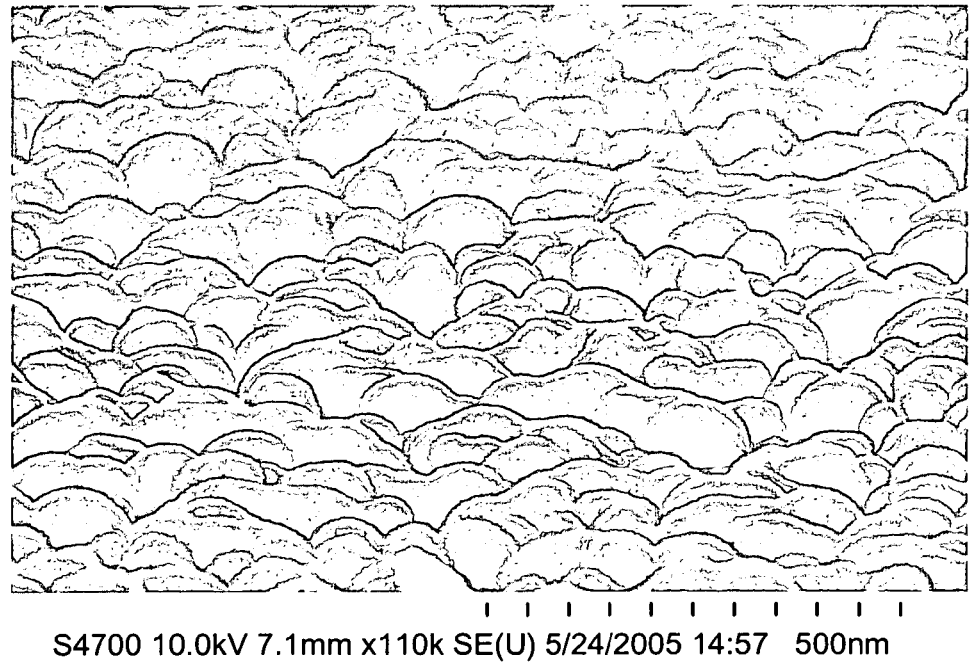
FIG. 23 is a photo of a TiN substrate, which has been subjected to the chemical vapor deposition process mentioned relative to FIG. 22.

Referring now to FIGS. 22-23, there is provided a set of photographs which illustrates the results of a germanium deposition at 320° Celsius, utilizing a 100 standard cubic centimeter per minute flow rate of $GeH_4$ gas, delivered at a pressure of 1000 mTorr, for a 20 minute period on a TiN substrate 32. In this regard, there is shown a resulting germanium film layer $A_{22}$ with a depth of about 0.0640 μm, a resulting TiN film layer $B_{22}$ with a depth of about 0.0270 μm, which has been deposited on a silicon dioxide layer $C_{22}$ with a depth of about 0.0930 μm. This process results in a Ge film deposition rate of about 32 Å per minute. Also with respect to FIGS. 20-22 it can be seen that the Ge film deposition is now amorphous, but the deposition appears somewhat irregular on the TiN substrate 32.

Referring now to FIGS. 24-25, there is provided a set of photographs, which illustrate the results of a germanium deposition using a combined 380° Celsius and 320° Celsius process. In this regard, a seed layer of silicon is deposited at 380° Celsius, utilizing a 500 standard cubic centimeter per minute flow rate of $SiH_4$ gas, delivered at a pressure of 1000 mTorr, for a 60 minute period on a TiN substrate 34. Next, a Ge film layer $A_{24}$ is deposited at 320° Celsius, utilizing a 200 standard cubic centimeter per minute flow rate of $GeH_4$ gas, delivered at a pressure of 1000 mTorr, for a 20-minute period. In this regard, there is shown a resulting Ge film layer $A_{24}$ with a depth of about 0.0640 μm, a resulting TiN film layer $B_{24}$ with a depth of about 0.0270 μm, which has been deposited on a silicon dioxide layer $C_{24}$ with a depth of about 0.0930 μm.

In summary then, a smooth continuous film results with a two-temperature process (one deposition), where the applied temperatures are sufficiently low (320° Celsius or less) to be completely compatible with Al, Cu wiring or GST material. It can also be concluded that $SiH_4$ gas will decompose on TiN more readily at these lower temperatures than on silicon or on silicon dioxide substrates. Finally, once the silicon layer is deposited, the $SiH_4$ gas will no longer decompose resulting in a self-limited process. This self-limited feature minimizes silicon deposition and therefore minimizes the silicon impact on the resulting Ge or SiGe device, which is very desirable. Most importantly, this self-limited process is accomplished without the use of special gases and instead utilizes readily available gases for Si, Ge, and SiGe depositions.

While a particular embodiment of the present invention has been disclosed, it is to be understood that various different modifications are possible and are contemplated within the true spirit and scope of the appended claims. For example, while the effect has been demonstrated for TiN substrates, it is fully expected that the effect will be useful on other metallic substrates such as Ta, TaN, W and WN, as well as other silicon type substrates, such as substrates comprising silicon dioxide ($SiO_2$), or silicon nitride (e.g., stoichiometric $Si_3N_4$, or non-stoichiometric $SiN_x$, where x<0). Also although the use of a common source catalytic gas source, such as $SiH_4$ gas, has been described relative to the preferred embodiment, it is contemplated that more expensive Si gas sources that decompose for depositing Si seed layers at lower temperatures could also be utilized. For example, disilane ($Si_2H_6$) and trisilane ($Si_3H_8$) could be utilized. Similarly alternative Ge gas sources could also be utilized like, $GeF_4$, $GeBr_4$, or $GeCl_4$. There is no intention, therefore, of limitations to the exact abstract or disclosure herein presented.

I claim:

1. A chemical vapor deposition process, comprising:
   using a first precursor gas at a temperature between about 320° C. and about 380° C. to deposit a self-limited silicon film layer on a metallic substrate; and
   using a second precursor gas at a temperature between about 320° C. and about 380° C. to deposit a germanium film layer on said self-limited silicon film layer.

2. A chemical vapor deposition process, comprising:
   using a precursor gas at a temperature of about 320° C. to deposit an amorphous germanium film layer on a metallic substrate.

3. The chemical vapor deposition process according to claim 2, further comprising:
   using another precursor gas at a temperature of about 320° C. to deposit a silicon seed layer on said metallic substrate.

4. The chemical vapor deposition process according to claim 3, wherein said metallic substrate is a TiN substrate.

5. The chemical vapor deposition process according to claim 4, wherein said another precursor gas is $SiH_4$.

6. The chemical vapor deposition process according to claim 5, wherein said silicon seed layer is a self-limited seed layer.

7. A chemical vapor deposition process, comprising:
   using a first precursor gas at a temperature of between about 320° C. and about 380° C. to deposit a silicon film layer on a metallic substrate; and
   using a second precursor gas at a temperature of between about 320° C. and about 380° C. to deposit a germanium film layer on said silicon film layer.

8. The chemical vapor deposition process according to claim 7, wherein said silicon film layer is a layer of silicon with a thickness of between about one atom thick to about three atoms thick.

9. The chemical vapor deposition process according to claim 8, wherein said layer of silicon is a self-limited layer.

10. The chemical vapor deposition process according to claim 8, wherein said metallic substrate is a TiN substrate.

11. The chemical vapor deposition process according to claim 10, wherein said first precursor gas is $SiH_4$.

12. The chemical vapor deposition process according to claim 10, wherein said second precursor gas is $GeH_4$.

13. The chemical vapor deposition process according to claim 7, wherein said germanium film layer is an amorphous layer.

14. The chemical vapor deposition process according to claim 7, wherein said germanium film layer is a polycrystalline layer.

15. A chemical vapor deposition process, comprising:
   using a first precursor gas at a temperature of between about 320° C. and about 380° C. to deposit a silicon seed film layer on a substrate; and
   using a second precursor gas at a temperature of between about 320° C. and about 380° C. to deposit a germanium film layer on said silicon seed film layer;

wherein the substrate comprises a metallic substrate, a silicon dioxide substrate, or a silicon nitride substrate.

16. The chemical vapor deposition process according to claim 15, wherein said substrate is a metallic substrate.

17. The chemical vapor deposition process according to claim 16, wherein said substrate is a TiN substrate.

18. The chemical vapor deposition process according to claim 15, wherein said substrate is a $SiO_2$ substrate.

19. The chemical vapor deposition process according to claim 15, wherein said silicon seed film layer is a self-limited seed film layer of silicon.

20. The chemical vapor deposition process according to claim 15, wherein said germanium film layer is amorphous.

21. The chemical vapor deposition process according to claim 15, wherein said germanium film layer is polycrystalline germanium.

22. The chemical vapor deposition process according to claim 15, wherein said germanium film is a homogeneous film layer.

23. The chemical vapor deposition process according to claim 15, wherein said first precursor gas is a silicon gas source.

24. The chemical vapor deposition process according to claim 23, wherein said silicon gas source is selected from a group consisting of $SiH_4$, $Si_2H_6$ and $Si_3H_8$.

25. The chemical vapor deposition process according to claim 15, wherein said second precursor gas is a germanium gas source.

26. The chemical vapor deposition process according to claim 25, wherein said germanium gas source is selected from a group consisting of $GeH_4$, $GeF_4$, $GeBr_4$, and $GeCl_4$.

27. The chemical vapor deposition process according to claim 16, wherein said metallic substrate is selected from a group of metallic substrates consisting of: TiN, Ta, TaN, W and WN.

28. The chemical vapor deposition process according to claim 15, wherein said substrate is a $SiN_X$ substrate, and wherein x>0.

29. The chemical vapor deposition process according to claim 20, further comprising:
   heating said amorphous germanium film to a temperature of between about 350° C. and about 425° C. a sufficient period of time to cause said amorphous germanium film to crystallize.

* * * * *